US010098239B2

(12) United States Patent
Cohen (10) Patent No.: US 10,098,239 B2
(45) Date of Patent: Oct. 9, 2018

(54) APPARATUS FOR ASSEMBLING LIGHT-EMITTING DIODE LIGHTING FIXTURES (71) Applicant: Yaron Cohen, Netivot (IL)

(72) Inventor: Yaron Cohen, Netivot (IL)

(73) Assignees: Yaron Cohen, Netivot (IL); Todd Jeremy Dunning, St. Catharines (CA)

( * ) Notice: Subject to any disclaimer, the term of this patent is extended or adjusted under 35 U.S.C. 154(b) by 145 days.

(21) Appl. No.: 15/276,759

(22) Filed: Sep. 26, 2016

(65) Prior Publication Data

US 2017/0094809 A1  Mar. 30, 2017

Related U.S. Application Data (60) Provisional application No. 62/232,559, filed on Sep. 25, 2015.

(51) Int. Cl.
| B23P 19/00 | (2006.01) |
| H05K 3/32 | (2006.01) |
| F21V 23/00 | (2015.01) |
| F21S 8/06 | (2006.01) |
| F21V 23/06 | (2006.01) |
| F21Y 115/10 | (2016.01) |

(52) U.S. Cl.
CPC ............... *H05K 3/32* (2013.01); *F21S 8/061* (2013.01); *F21V 23/001* (2013.01); *F21V 23/005* (2013.01); *F21V 23/06* (2013.01); *F21Y 2115/10* (2016.08)

(58) Field of Classification Search
CPC ....... H05K 3/32; F21V 23/005; F21V 23/001; F21V 23/06; F21S 8/061
See application file for complete search history.

(56) References Cited

U.S. PATENT DOCUMENTS

| 7,726,837 | B2 * | 6/2010 | Ewert | F21S 8/00 340/815.45 |
| 8,534,867 | B1 * | 9/2013 | Beadle | F21V 17/002 362/153.1 |
| 8,562,180 | B2 * | 10/2013 | Alexander | F21V 19/001 362/147 |
| 8,573,815 | B2 * | 11/2013 | Mallory | F21S 8/088 362/311.01 |
| 8,963,410 | B2 * | 2/2015 | Wu | F21K 9/13 313/318.01 |
| 9,726,364 | B1 * | 8/2017 | Mart | F21V 29/61 |
| 2012/0320579 | A1 * | 12/2012 | Ferguson | F21V 29/02 362/235 |

* cited by examiner

*Primary Examiner* — Paul D Kim (57) ABSTRACT

An apparatus for assembling a LED lighting fixture contains a power cable, an elongated coupler, a base plate, a protruding terminal, a receiving terminal, and a lighting assembly. The power cable is terminally fixed to a distal end of the elongated coupler. On the other hand, the receiving terminal is integrated into a proximal end of the elongated coupler. When the base plate, which contains the lighting assembly, needs to be attached, the protruding terminal is removably positioned into the receiving terminal. As a result, the current path from the elongated coupler to the lighting assembly is completed. The ability to conveniently detach the base plate allows the user to use different lighting assemblies as preferred. If the exterior appearance of the apparatus needs to change, a fixture housing is used.

8 Claims, 16 Drawing Sheets

APPARATUS FOR ASSEMBLING LIGHT-EMITTING DIODE LIGHTING FIXTURES

The current application claims a priority to the U.S. Provisional Patent application Ser. No. 62/232,559 filed on Sep. 25, 2015. The current application is filed on Sep. 26, 2016 while Sep. 25, 2016 was on a weekend.

FIELD OF THE INVENTION

The present invention generally relates to light-emitting diode lighting fixtures. More specifically, the present invention introduces an apparatus that eliminates the need to solder LED lighting fixtures. Therefore, by utilizing the present invention the LED lighting fixture process can be simplified.

BACKGROUND OF THE INVENTION

The use of light-emitting diode (LED) lighting fixtures has gained momentum over the recent past. The improved strength, compact size, reliability, and lower energy consumption are some of the main reasons for the increased use of LED lighting fixtures. Even though the LED lighting fixtures have multiple advantages, there are certain significant disadvantages too.

The cost related with LED lighting fixtures is one of the most significant drawbacks. Since the initial cost is high, having to replace a LED lighting fixture on a regular basis can be disadvantageous to the user. Most of the existing LED lighting fixtures require the entire unit to be replaced regardless of the number of components damaged. In the long term, this can be disadvantageous to the user.

The installation of a LED lighting fixture needs to be carefully executed since the performance of the lighting fixtures is dependent on correctly managing the heat generated by the LED. Failure to do so, can lead to overheating eventually leading the device to failure. Soldering is an essential part of installing most of the existing LED lighting fixtures. For a user who is not familiar with the process, the soldering process can be time consuming and also stressful. Therefore, the need for a method that can either reduce the time spent on assembling or the need for a method that can eliminate the soldering process is clearly evident.

Another disadvantage with assembling existing LED lighting fixtures is the need to have multiple tools. The need to assemble tools can be a time consuming process. Therefore, a method that allows the user to assemble a lighting fixture without the use of multiple tools is clearly evident.

The objective of the present invention is to address the aforementioned issues. More specifically, the present invention introduces an apparatus that eliminates the soldering process which is mandatory with existing LED lighting fixtures. Additionally, the present invention also provides the convenience of replacing a part of the apparatus in contrast to removing and replacing multiple components.

DETAIL DESCRIPTIONS OF THE INVENTION

All illustrations of the drawings are for the purpose of describing selected versions of the present invention and are not intended to limit the scope of the present invention.

The present invention introduces an apparatus that allows a user to assemble a light-emitting diode (LED) lighting fixture within a short time period. The need for fastening or welding is eliminated since the components of the present invention are removably attached to each other. In order to do so, the present invention comprises a power cable 1, an elongated coupler 2, and a lighting assembly 8. The power cable 1 which is fixed to the elongated coupler 2 is then removably attached to the lighting assembly 8 in the present invention. Since no electrical tool or other comparable tool is used during the assembly process, safety issues that are prevalent with existing LED fixtures are addressed through the present invention. Moreover, when comparing to other existing LED fixtures, the present invention functions with greater efficiency since the assembly time is significantly reduced.

Figure 1:
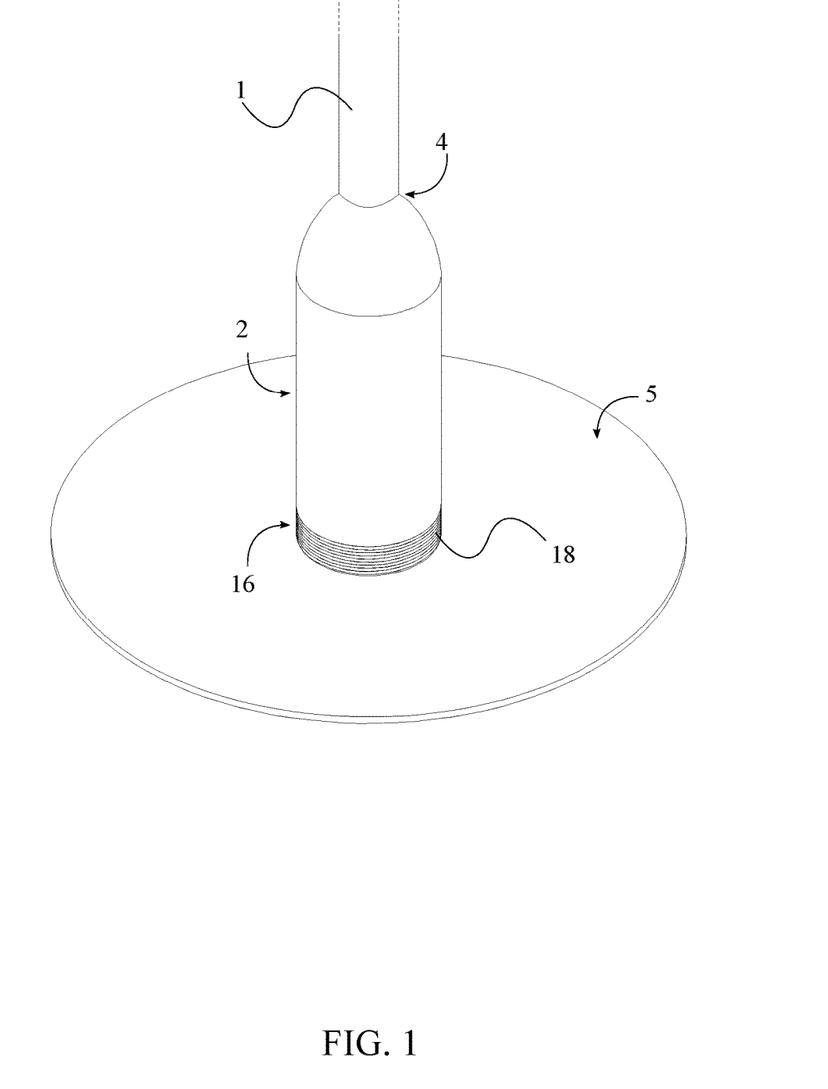
FIG. 1 is a perspective view of the present invention.
Figure 2:
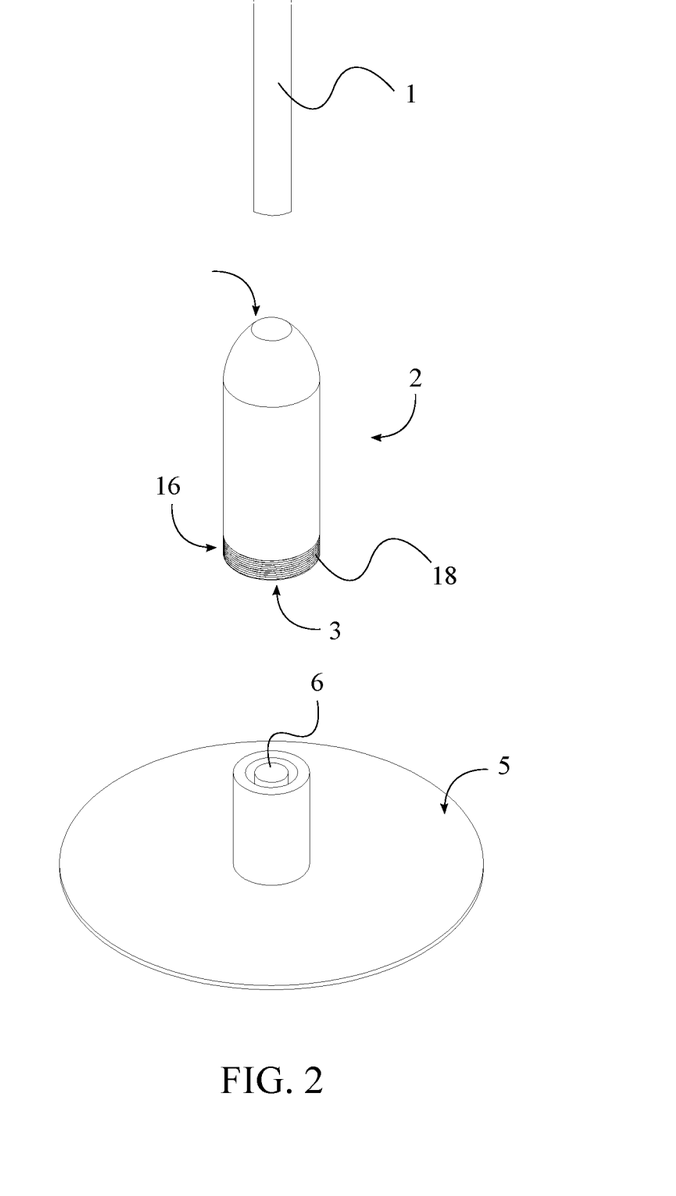
FIG. 2 is a perspective exploded view of the present invention.
Figure 3:
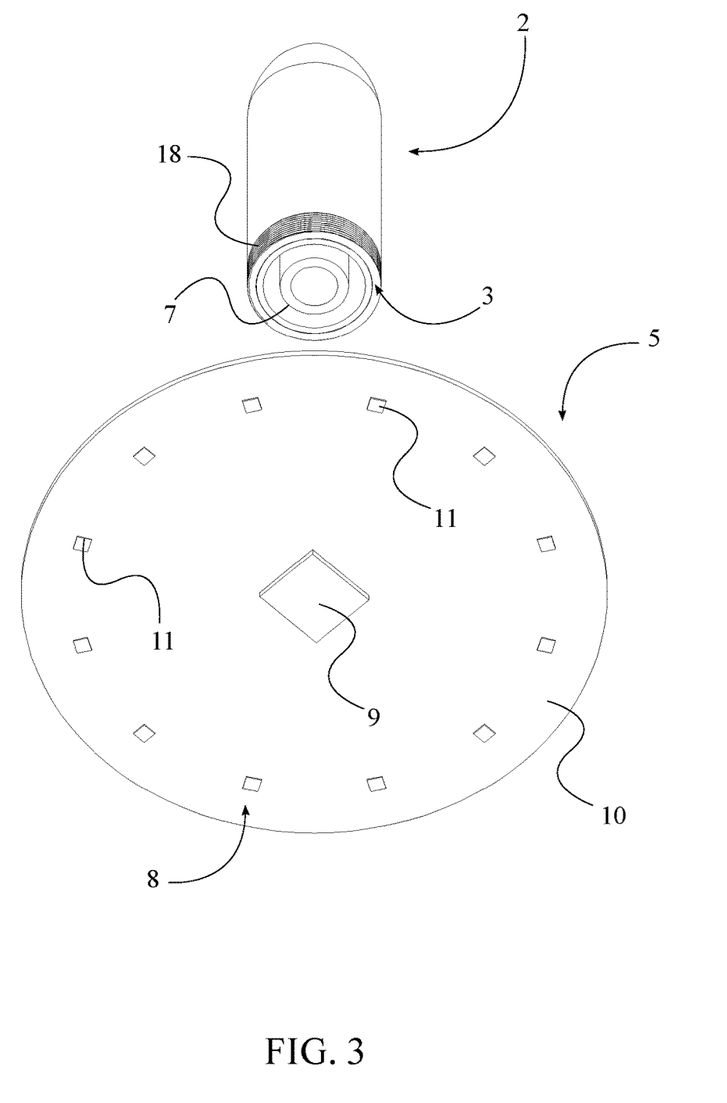
FIG. 3 is a bottom perspective exploded view illustrating the elongated coupler and the base plate.

As illustrated in FIGS. 1-3, in addition to the power cable 1, the elongated coupler 2, and the lighting assembly 8, the present invention further comprises a base plate 5, a protruding terminal 6, and a receiving terminal 7. The power cable 1 draws current into the present invention. The properties of the power cable 1 can vary according to the circumstance the present invention is used in. As an example, the power cable 1 properties can vary according to the amperage that is used in the power cable 1. The power received from the power cable 1 is transferred onto the remaining components of the present invention through the elongated coupler 2. In the preferred embodiment of the present invention, the elongated coupler 2 is a direct current (DC) connector. However, different connectors can be used as the elongated coupler 2 in different embodiments of the present invention. The protruding terminal 6 and the receiving terminal 7 are used in the process of attaching the base plate 5 to the elongated coupler 2. As a result of attaching the base plate 5, with the use of the protruding terminal 6, a current path from the power cable 1 to the lighting assembly 8 is completed since the lighting assembly 8 is mounted onto the base plate 5. Therefore, any lighting arrangement configured by the lighting assembly 8 is appropriately powered. Moreover, the user is able to interchange the lighting assembly 8 simply by detaching from the receiving terminal 7 and attaching a second base plate with a second lighting assembly which is mounted onto the second base plate. This allows the user to switch the lighting assembly 8 if there is a component failure in contrast to repairing the lighting assembly 8 with the use of special tools. Additionally, the need to hand wire the components of the lighting assembly 8 is also eliminated through the use of the present invention.

Figure 4:
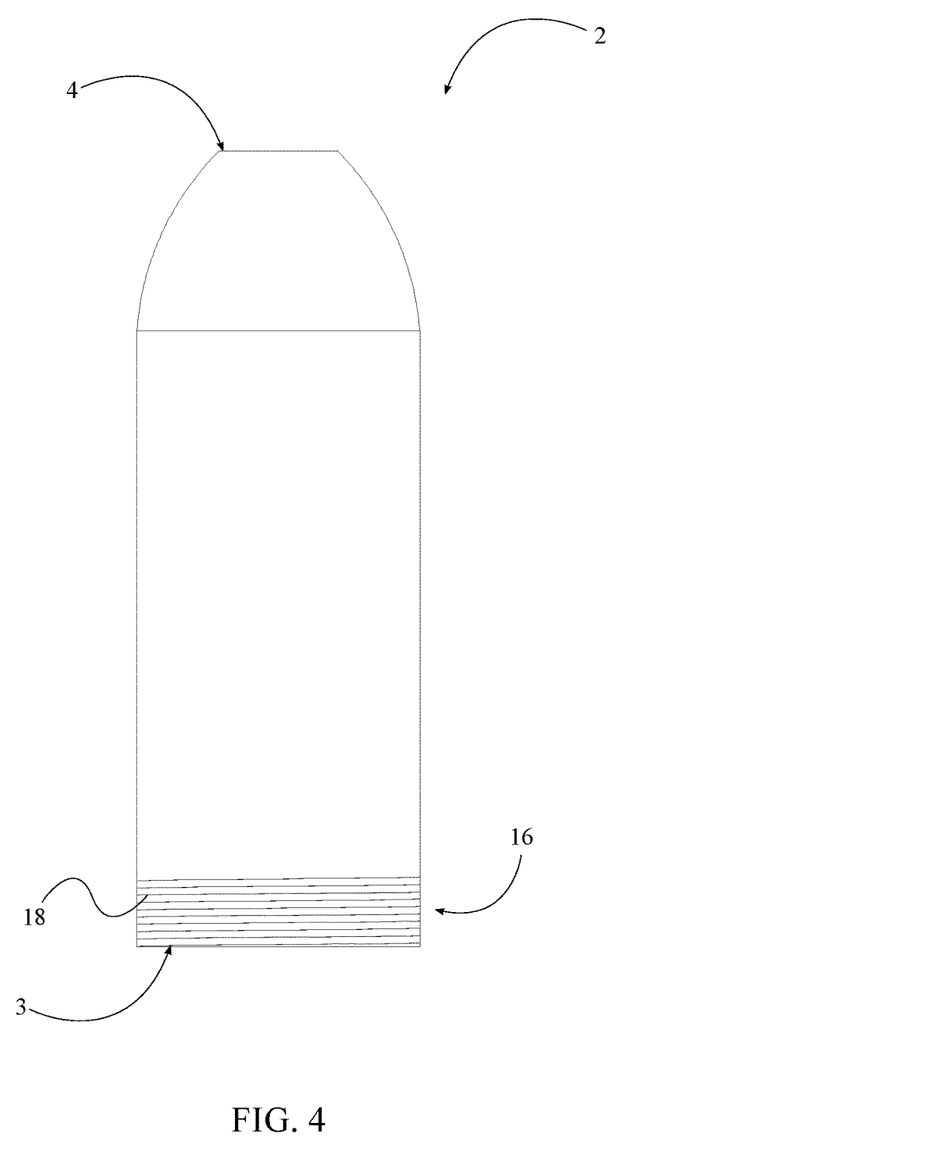
FIG. 4 is a side view of the elongated coupler.
Figure 5:
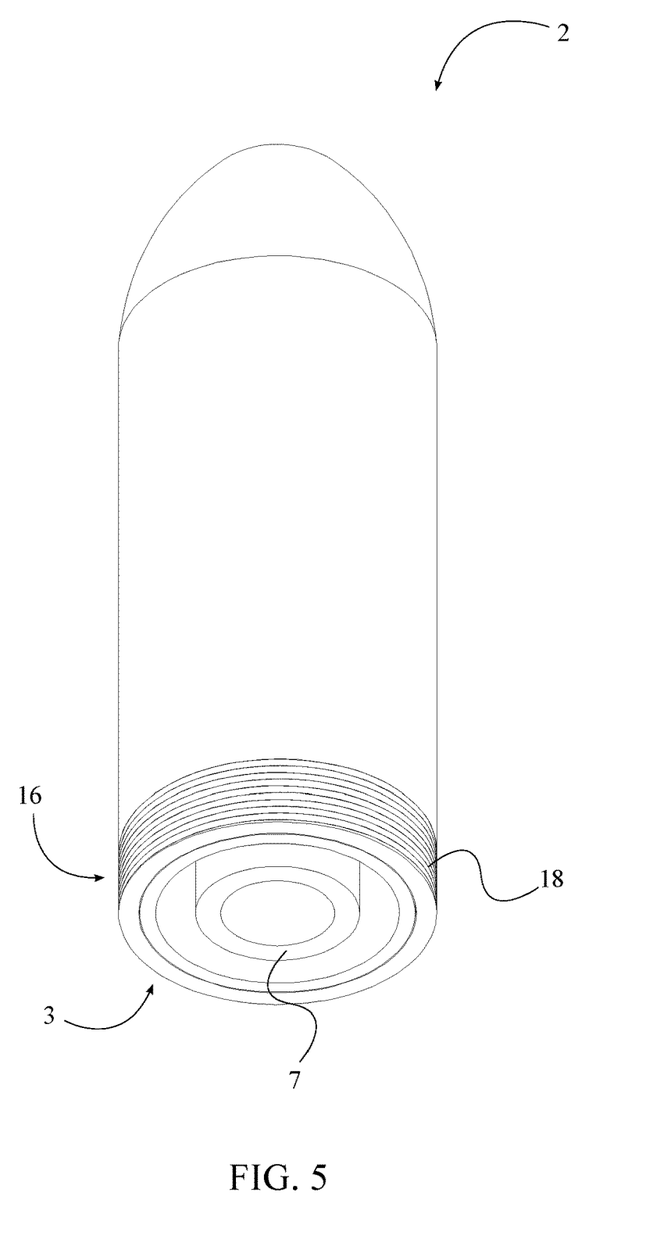
FIG. 5 is a bottom perspective of the elongated coupler.
Figure 6:
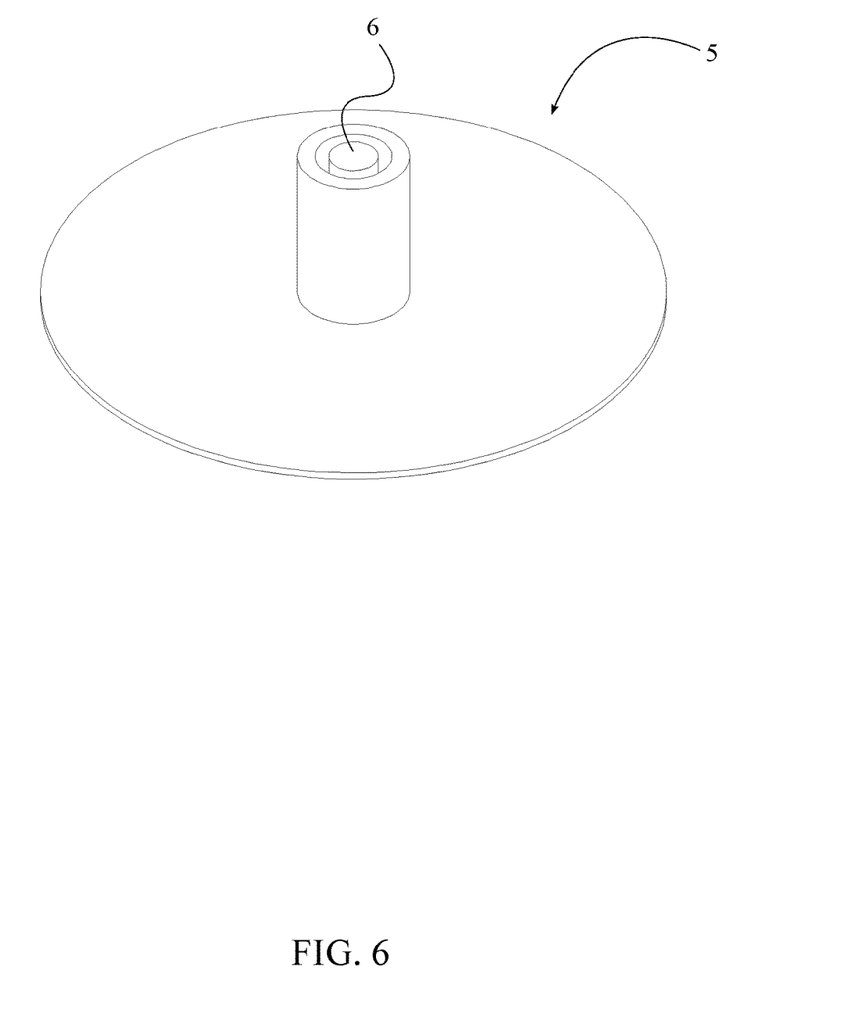
FIG. 6 is a perspective view of the base plate.
Figure 7:
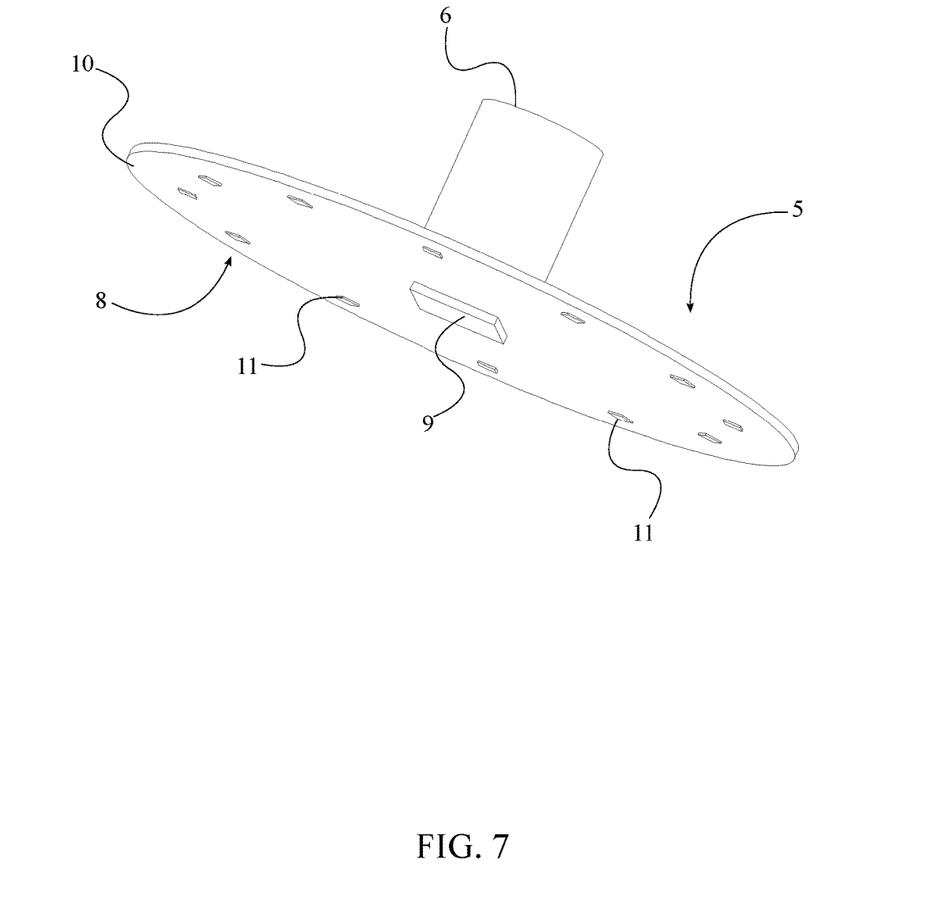
FIG. 7 is a bottom perspective view of the base plate.
Figure 8:
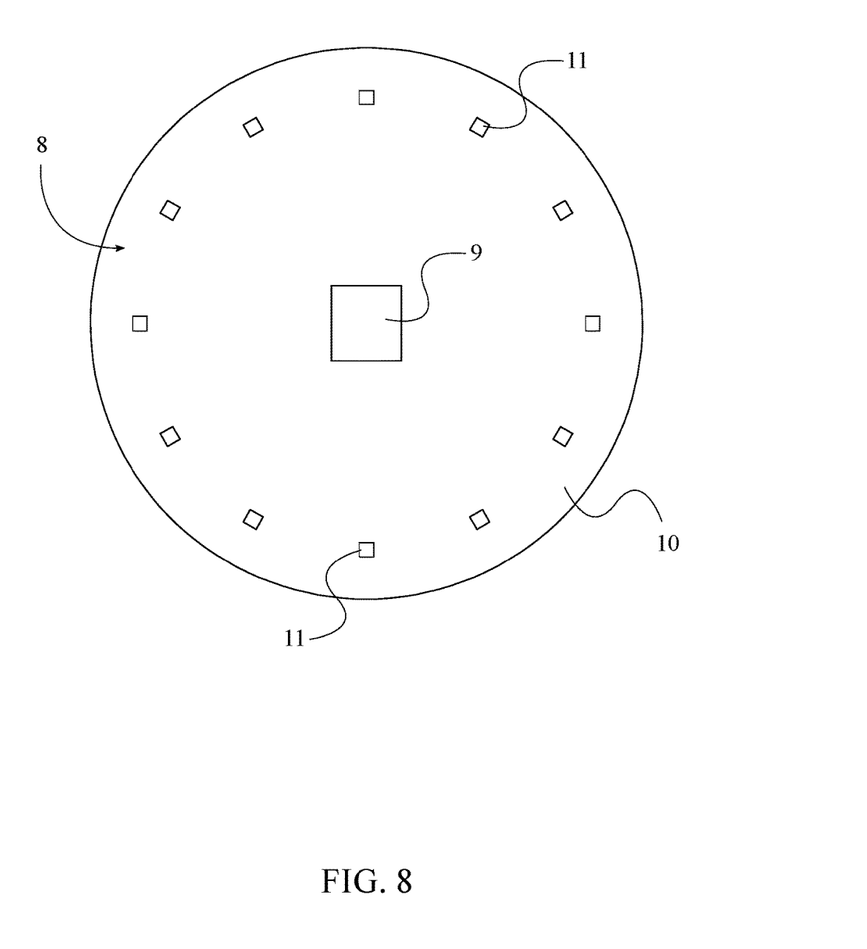
FIG. 8 is bottom view of the base plate.
Figure 9:
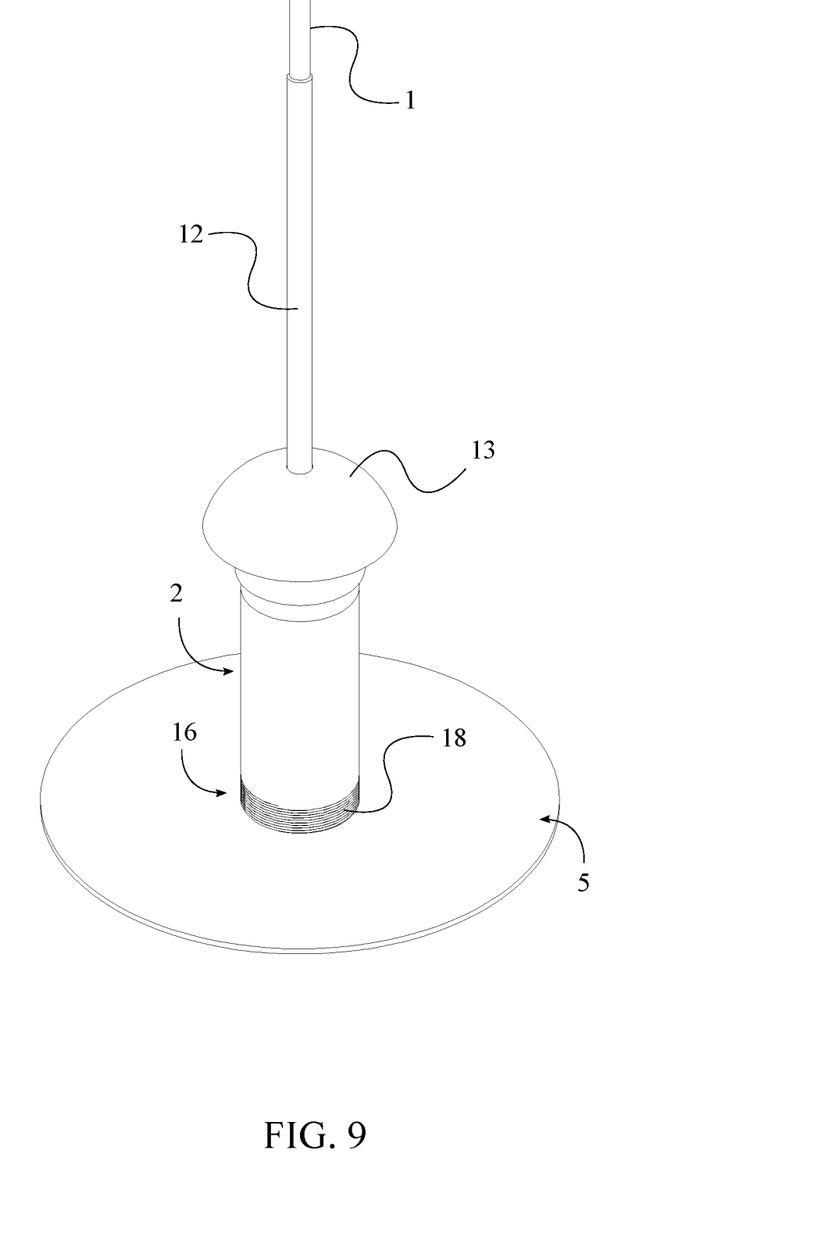
FIG. 9 is a perspective view of the of the present invention, wherein the stopper and the sleeve are illustrated.
Figure 10:
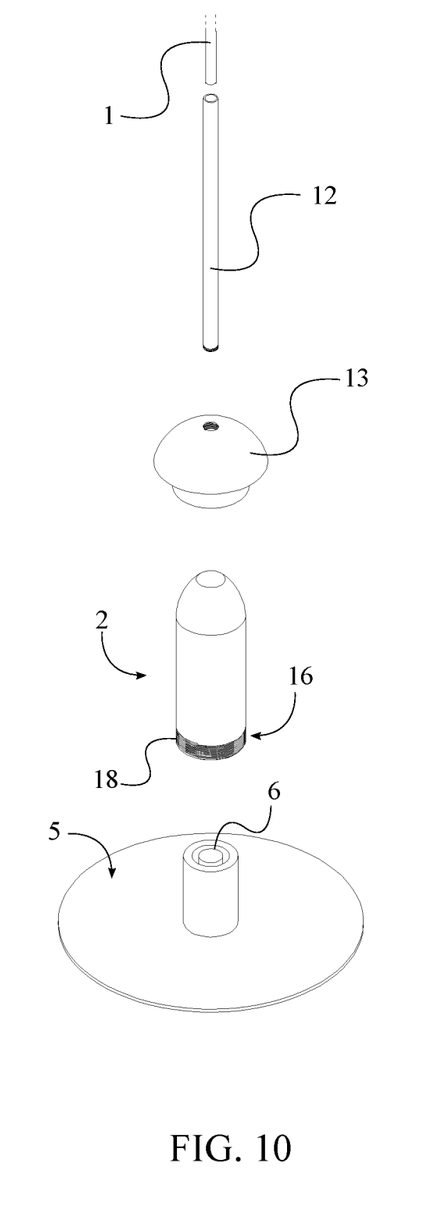
FIG. 10 is a perspective exploded view of the present invention, wherein the stopper and sleeve are illustrated.
Figure 11:
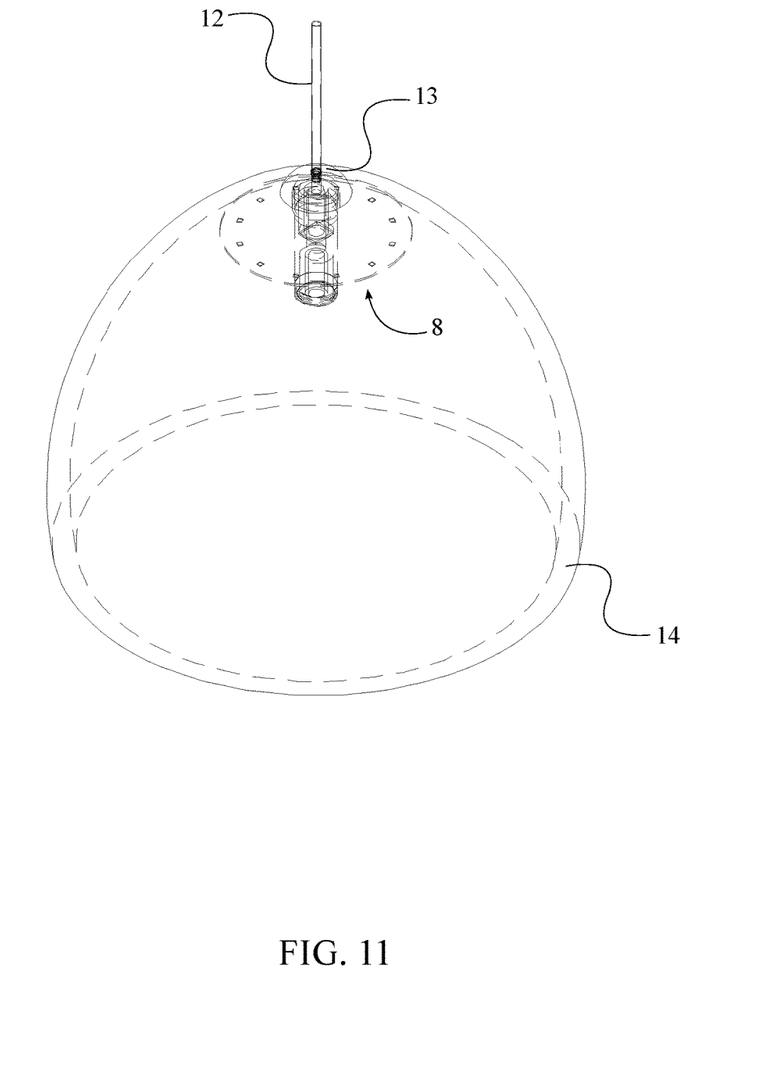
FIG. 11 is a perspective view of the present invention, wherein the fixture housing is illustrated.
Figure 12:
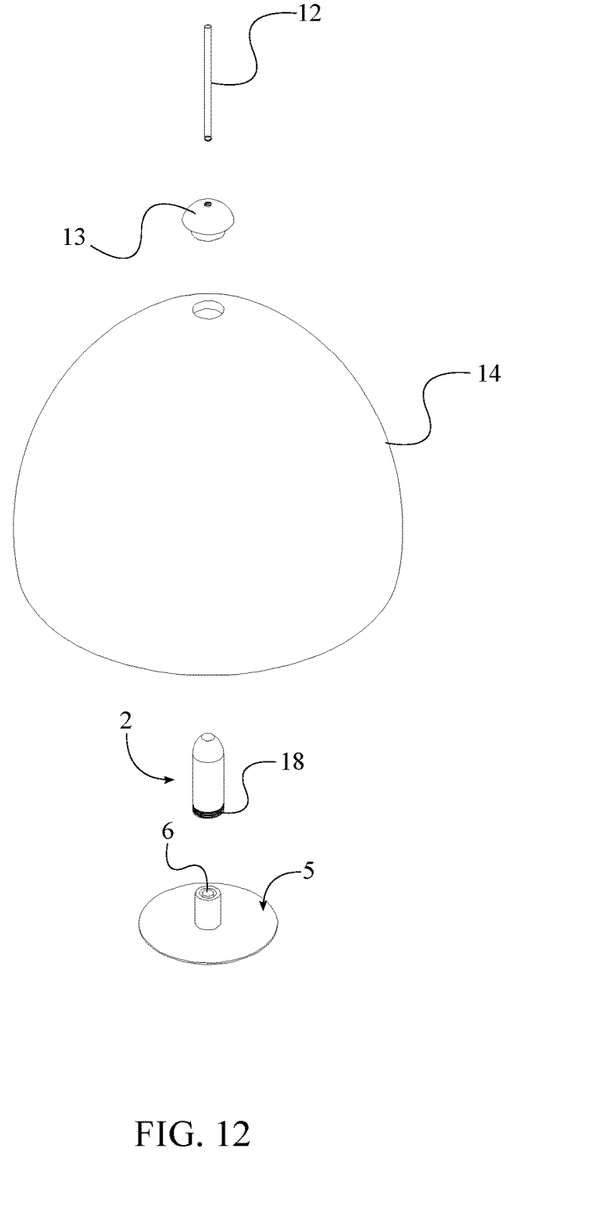
FIG. 12 is a perspective exploded view of the present invention, wherein the fixture housing is illustrated.

The elongated coupler 2 comprises a proximal end 3 and a distal end 4. The power cable 1 is terminally fixed to the distal end 4 allowing the current to flow into the elongated coupler 2. On the other hand, the receiving terminal 7 is integrated into the proximal end 3 so that any power provided at the distal end 4 can be drawn out via the receiving terminal 7 at the proximal end 3. The proximal end 3 and the distal end 4 are illustrated in FIG. 4 and FIG. 5. In order to do so transfer current, the receiving terminal 7 is electrically connected to the power cable 1. As described earlier, in the process of completing the circuit for the lighting assembly 8, the protruding terminal 6 is removably attached into the receiving terminal 7. As a result, current transfers from the receiving terminal 7 into the protruding terminal 6. Since the protruding terminal 6 is connected onto the base plate 5, the base plate 5 is also attached in the process of attaching the protruding terminal 6. Moreover, the lighting assembly 8 is mounted onto the base plate 5 opposite to the protruding terminal 6 and is electrically connected to the protruding terminal 6. Therefore, the current is transferred to the lighting assembly 8 through the protruding terminal 6. In other words, the current path from the power cable 1 to the lighting assembly 8 is completed by attaching the protruding terminal 6 into the receiving terminal 7. The base plate is illustrated in FIGS. 6-8.

In the preferred embodiment of the present invention, the lighting assembly 8 comprises a bridging printed circuit board (PCB) 9, a distributing PCB 10, and a plurality of LEDs 11. The base plate 5 which holds the lighting assembly 8 is made of Aluminum in the preferred embodiment of the present invention. However, other comparable material can be used to make the base plate 5 in different embodiments of the present invention. The electrical conductive properties of the base plate 5 can result in a short circuit if the current path is completed through the base plate 5. In order to avoid such circumstances, the protruding terminal 6 is connected to the distributing PCB 10 through the bridging PCB 9. More specifically, the bridging PCB 9 is electrically connected to the protruding terminal 6. In order to continue the current flow, the bridging PCB 9 is electronically connected to the distributing PCB 10 which is also electronically connected to each of the plurality of LEDs 11. The electrical connection between the distributing PCB 10 and the plurality of LEDs 11 ensures that the required lighting pattern is appropriately powered.

As illustrated in FIGS. 9-12, the present invention further comprises a sleeve 12, a stopper 13, and a fixture housing 14. The sleeve 12 and stopper 13 are mainly used to orient the power cable 1. On the other hand, the fixture housing 14 is mainly used for appearance purposes. Therefore, the fixture housing 14 can vary in different embodiments of the present invention allowing the user to change the exterior outlook of the present invention. When considering the positioning, the stopper 13 is terminally connected to the sleeve 12. The terminal connection allows the power cable 1 to conveniently traverse through the sleeve 12, through the stopper 13, and through the fixture housing 14. As a result, the sleeve 12, the stopper 13, and the fixture housing 14 is linearly aligned and remains stationary. More precisely, the fixture housing 14 is pressed in between the stopper 13 and the elongated coupler 2 so that the fixture housing 14 remains stationary.

Figure 13:
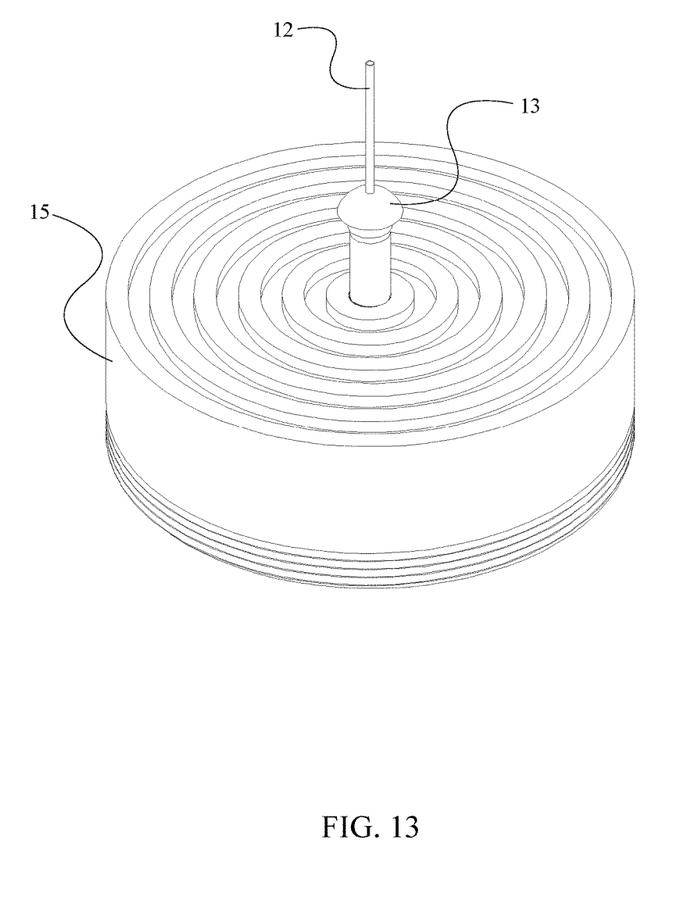
FIG. 13 is a perspective view of the present invention, wherein the fixture base is illustrated.
Figure 14:
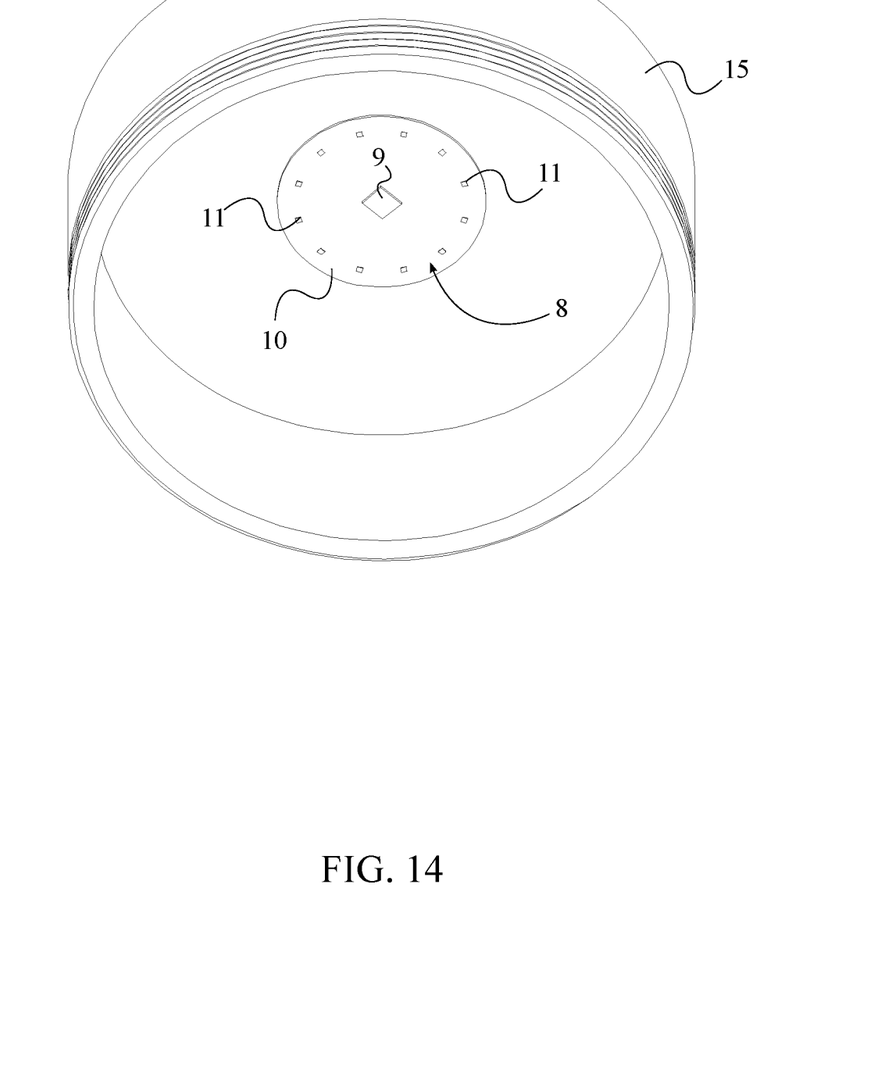
FIG. 14 is a bottom perspective view of the present invention, wherein the fixture base is illustrated.
Figure 15:
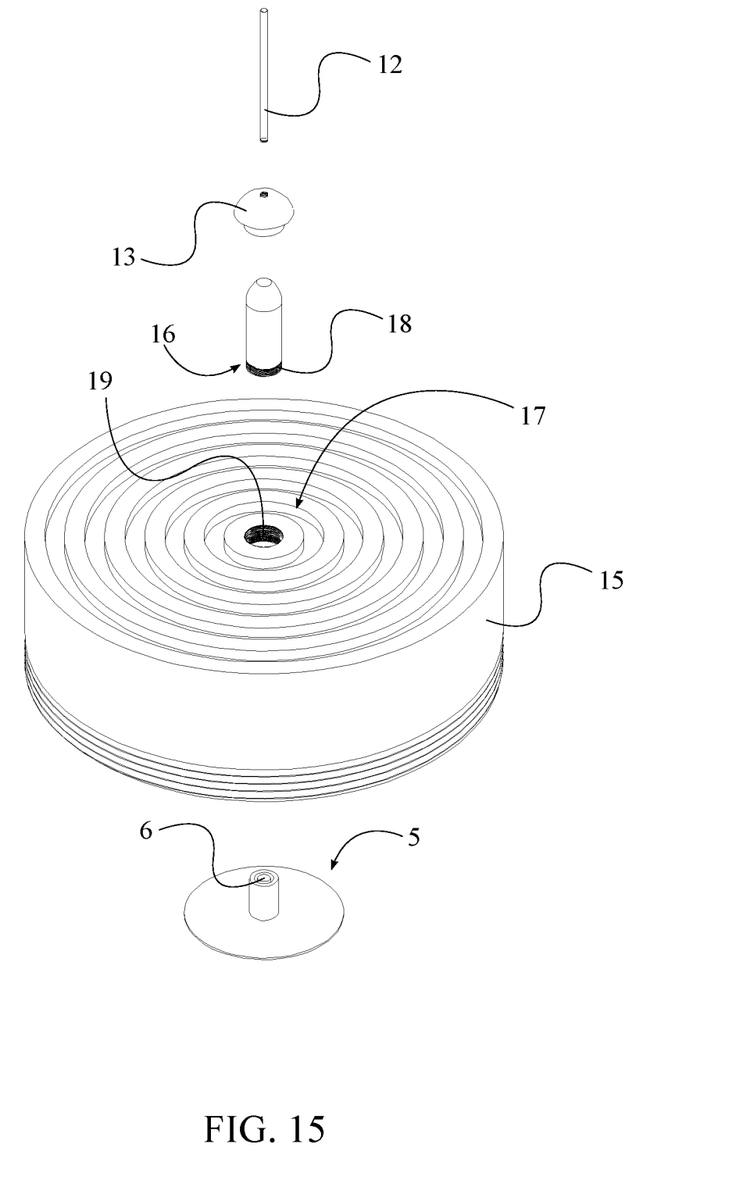
FIG. 15 is a perspective exploded view, wherein the fixture base is illustrated.

As mentioned earlier, the fixture housing 14 can vary in different embodiments of the present invention. Depending on the fixture housing 14, the present invention comprises a fixture base 15 which is used to hold the weight of the present invention. The use of the fixture base 15 is illustrated in FIGS. 13-15. The fixture base 15, which can vary in different embodiments of the present invention, eliminates the possibility of any weight being applied to the power cable 1 when the present invention is in use. The present invention comprises a first engagement feature 16 and a second engagement feature 17, both of which are used to detachably attach the elongated coupler 2 to the fixture base 15 so that no stress is applied on the power cable 1. In the preferred embodiment of the present invention, the first engagement feature 16 is laterally integrating into the elongated coupler 2 adjacent to the proximal end 3. On the other hand, the second engagement feature 17 is integrated through the fixture base 15. When the need to attach the elongated coupler 2 to the fixture base 15 occurs, the first engagement feature 16 is engaged with the second engagement feature 17. The first engagement feature 16 and the second engagement feature 17 can vary in different embodiments of the present invention. In the preferred embodiment of the present invention, the first engagement feature 16 is a male threading 18. In contrast, the second engagement feature 17 is a female threading 19 in the preferred embodiment of the present invention. The positioning of the first engagement feature 16 ensures that the weight of the fixture base 15 and other related components are entirely applied at the first engagement feature 16. In order to do so, the elongated coupler 2 is made of a material that is stress tested and guaranteed to hold large weights. Moreover, since the weight of the fixture base 15 is entirely applied at the engagement between the first engagement feature 16 and the second engagement feature 17, no weight is applied to the connection between the receiving terminal 7 and the protruding terminal 6.

Figure 16:
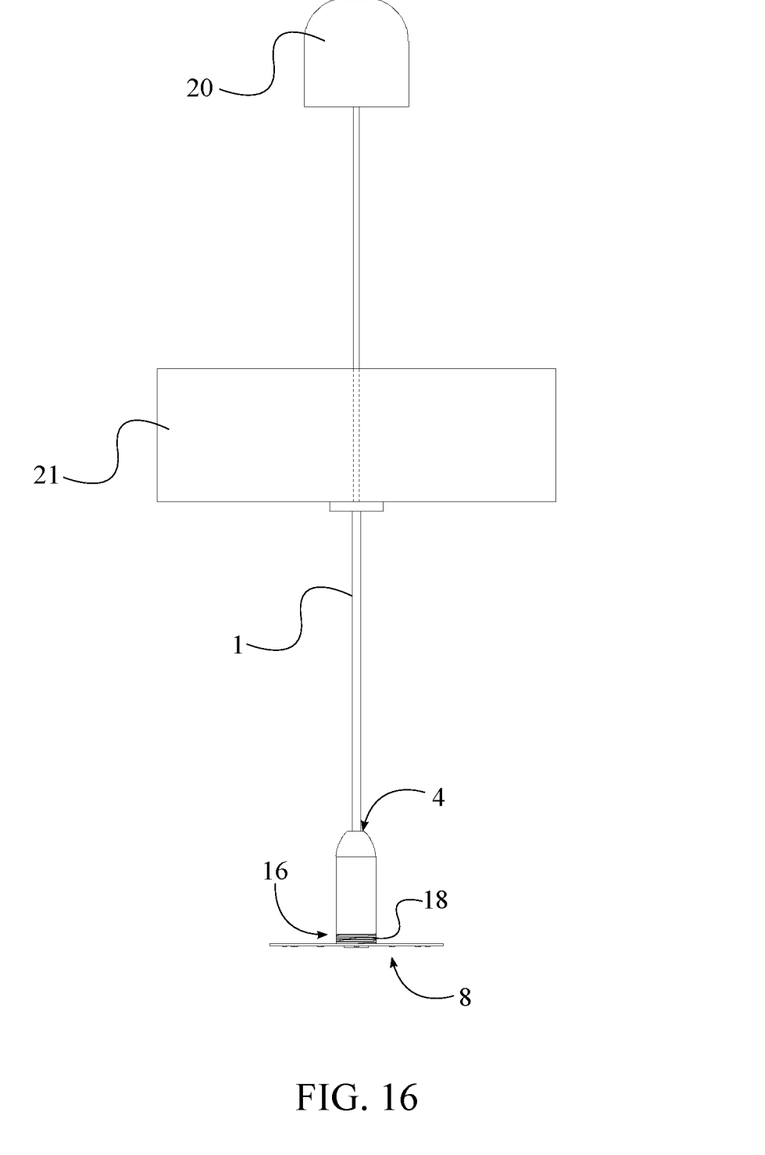
FIG. 16 is a side view of the present invention, wherein the ceiling mount and the LED driver are illustrated.

In order to protect the plurality of LEDs 11 from voltage or current fluctuations, the present invention comprises a LED driver 20. In order to be electrically connected to the plurality of LEDs 11, the LED driver 20 is electrically integrated along the power cable 1. Moreover, the present invention is intended to be hung from the ceiling for aesthetically pleasing appearances. In order to do so, the present invention also comprises, a ceiling mount 21. The power cable 1 traverses into the ceiling mount 21 so that the remaining components of the present invention can be hung under the ceiling mount 21. In order to do so, the elongated coupler 2 is tethered to the ceiling mount 21 by the power cable 1. The use of the LED driver 20 and the ceiling mount 21 is illustrated in FIG. 16.

When utilizing the present invention, the following process flow is generally followed. Initially, the ceiling mount 21 is appropriately positioned at a preferred location. Next, the power cable 1 which extends through the sleeve 12 and through the stopper 13 is positioned through the fixture housing 14. In the resulting position, the fixture housing 14 is pressed in between the stopper 13 and the elongated coupler 2. Next, the protruding terminal 6 is positioned into the receiving terminal 7. However, if the fixture base 15 is available, the first engagement feature 16 is initially engaged with the second engagement feature 17 and then the protruding terminal 6 is positioned into the receiving terminal 7. As an end result, the user can assemble the entire lighting fixture without the use of any tools. Moreover, the user is also able to change the lighting assembly 8 simply by detaching from the receiving terminal 7. If the need to change the exterior appearance occurs, the user can conveniently switch the fixture housing 14.

Although the invention has been explained in relation to its preferred embodiment, it is to be understood that many other possible modifications and variations can be made without departing from the spirit and scope of the invention as hereinafter claimed.

What is claimed is:

1. An apparatus for assembling a light-emitting diode (LED) lighting fixture comprises:
    a power cable;
    an elongated coupler;
    a base plate;
    a protruding terminal;
    a receiving terminal; and
    a lighting assembly,
    wherein the elongated coupler comprises a proximal end and a distal end,
    the power cable is terminally fixed to the distal end,
    the receiving terminal is integrated into the proximal end,
    the receiving terminal is electrically connected to the power cable,
    the protruding terminal is connected onto the base plate,
    the protruding terminal is removably attached into the receiving terminal,
    the lighting assembly is mounted onto the base plate, opposite to the protruding terminal, and
    the protruding terminal is electrically connected to the lighting assembly.

2. The apparatus for assembling a LED lighting fixture as claimed in claim 1 further comprises:
    the lighting assembly comprises a bridging printed circuit board (PCB), a distributing PCB and a plurality of LEDs,
    wherein the bridging PCB is electrically connected to the protruding terminal,
    the bridging PCB is electronically connected to the distributing PCB, and
    the distributing PCB is electronically connected to each of the plurality of LEDs.

3. The apparatus for assembling a LED lighting fixture as claimed in claim 1 further comprises:
    a sleeve;
    a stopper; and
    a fixture housing,
    wherein the stopper is terminally connected to the sleeve,
    the power cable traverses through the sleeve, through the stopper, and through the fixture housing, and
    the fixture housing is pressed in between the stopper and the elongated coupler.

4. The apparatus for assembling a LED lighting fixture as claimed in claim 1 further comprises:
    a fixture base;
    a first engagement feature; and
    a second engagement feature,
    wherein the first engagement feature is laterally integrating into the elongated coupler, adjacent to the proximal end,
    the second engagement feature is integrated through the fixture base, and
    the first engagement feature is engaged with the second engagement feature.

5. The apparatus for assembling a LED lighting fixture as claimed in claim 4, wherein the first engagement feature is a male threading.

6. The apparatus for assembling a LED lighting fixture as claimed in claim 5, wherein the first engagement feature is a female threading.

7. The apparatus for assembling a LED lighting fixture as claimed in claim 1 further comprises:
    an LED driver,
    wherein the LED driver is electrically integrated along the power cable.

8. The apparatus for assembling a LED lighting fixture as claimed in claim 1 further comprises:
    a ceiling mount,
    wherein the power cable traverses into the ceiling mount, and
    the elongated coupler is tethered to the ceiling mount by the power cable.

* * * * *